(12) United States Patent
Sugiyama et al.

(10) Patent No.: US 9,685,242 B2
(45) Date of Patent: Jun. 20, 2017

(54) MEMORY SYSTEM

(71) Applicant: KABUSHIKI KAISHA TOSHIBA, Tokyo (JP)

(72) Inventors: Mitsuhiko Sugiyama, Yokosuka Kanagawa (JP); Katsuhiko Ueki, Katsuhiko Tokyo (JP)

(73) Assignee: Kabushiki Kaisha Toshiba, Tokyo (JO)

( * ) Notice: Subject to any disclaimer, the term of this patent is extended or adjusted under 35 U.S.C. 154(b) by 73 days.

(21) Appl. No.: 14/637,293

(22) Filed: Mar. 3, 2015

(65) Prior Publication Data

US 2015/0261604 A1 Sep. 17, 2015

Related U.S. Application Data

(60) Provisional application No. 61/951,124, filed on Mar. 11, 2014, provisional application No. 62/109,948, filed on Jan. 30, 2015.

(51) Int. Cl.
*H04L 1/00* (2006.01)
*G11C 29/52* (2006.01)
*G11C 29/02* (2006.01)
*G11C 29/42* (2006.01)
*G06F 11/10* (2006.01)
*G11C 29/04* (2006.01)

(52) U.S. Cl.
CPC .......... *G11C 29/52* (2013.01); *G06F 11/1048* (2013.01); *G11C 29/028* (2013.01); *G11C 29/42* (2013.01); *G11C 2029/0411* (2013.01)

(58) Field of Classification Search
CPC .................................................... H04L 1/0057
USPC ................ 714/776, 773, 758, 755, 701, 800
See application file for complete search history.

(56) References Cited

U.S. PATENT DOCUMENTS

| | | | |
|---|---|---|---|
| 5,765,185 A * | 6/1998 | Lambrache | G06F 11/1068 365/189.05 |
| 6,961,890 B2 | 11/2005 | Smith | |
| 8,122,323 B2 | 2/2012 | Leung et al. | |
| 8,307,261 B2 | 11/2012 | Wu et al. | |
| 8,560,918 B1 * | 10/2013 | Yang | H03M 13/152 714/758 |
| 8,726,140 B2 * | 5/2014 | Chang | G06F 11/1068 714/800 |

(Continued)

FOREIGN PATENT DOCUMENTS

| JP | 2003131954 A | 5/2003 |
|---|---|---|
| JP | 2012155737 A | 8/2012 |

*Primary Examiner* — Fritz Alphonse
(74) *Attorney, Agent, or Firm* — Patterson & Sheridan, LLP

(57) ABSTRACT

According to one embodiment, a memory system includes a memory, an encoding unit, an interface unit, a decoding unit and a changing unit. The encoding unit is configured to encode first data to generate second data. A size of the second data is equal to a first size. A size of the first data is equal to a second size which is smaller than the first size. The interface unit is configured to store the second data in the memory and to read the second data from the memory. The decoding unit is configured to decode the second data read from the memory to perform detection of an error. The changing unit is configured to change the second size according to an occurrence situation of the error.

20 Claims, 13 Drawing Sheets

(56) References Cited

U.S. PATENT DOCUMENTS

| | | | | |
|---|---|---|---|---|
| 8,856,622 B2 * | 10/2014 | Ramamoorthy | .... | G06F 11/1068 365/185.02 |
| 8,924,820 B2 * | 12/2014 | Hara | ........ | G06F 12/0246 714/701 |
| 8,992,869 B2 * | 3/2015 | Ratts | ........ | B01D 53/9404 423/213.2 |
| 2008/0148126 A1 * | 6/2008 | Eilert | ........ | G06F 11/1068 714/755 |

* cited by examiner

US 9,685,242 B2

MEMORY SYSTEM

CROSS-REFERENCE TO RELATED APPLICATIONS

This application is based upon and claims the benefit of priority from U.S. Provisional Application No. 61/951,124, filed on Mar. 11, 2014; and U.S. Provisional Application No. 62/109,948, filed on Jan. 30, 2015; the entire contents of all of which are incorporated herein by reference.

FIELD

Embodiments described herein relate generally to a memory system.

BACKGROUND

In a memory system using a non-volatile memory such as a NAND flash memory, repetitive rewriting causes the memory cells of the non-volatile memory to be physically worn out. This increases the probability of occurrence of read error. For read error, generally, an error correcting code is preliminarily added to data so as to perform writing, and an error correcting process is performed during reading so as to restore correct data.

DETAILED DESCRIPTION

In general, according to one embodiment, a memory system includes a memory, an encoding unit, an interface unit, a decoding unit and a changing unit. The encoding unit is configured to encode first data to generate second data. A size of the second data is equal to a first size. A size of the first data is equal to a second size which is smaller than the first size. The interface unit is configured to store the second data in the memory and to read the second data from the memory. The decoding unit is configured to decode the second data read from the memory to perform detection of an error. The changing unit is configured to change the second size according to an occurrence situation of the error.

Exemplary embodiments of a memory system will be explained below in detail with reference to the accompanying drawings. The present invention is not limited to the following embodiments.

(First Embodiment)

Figure 1:
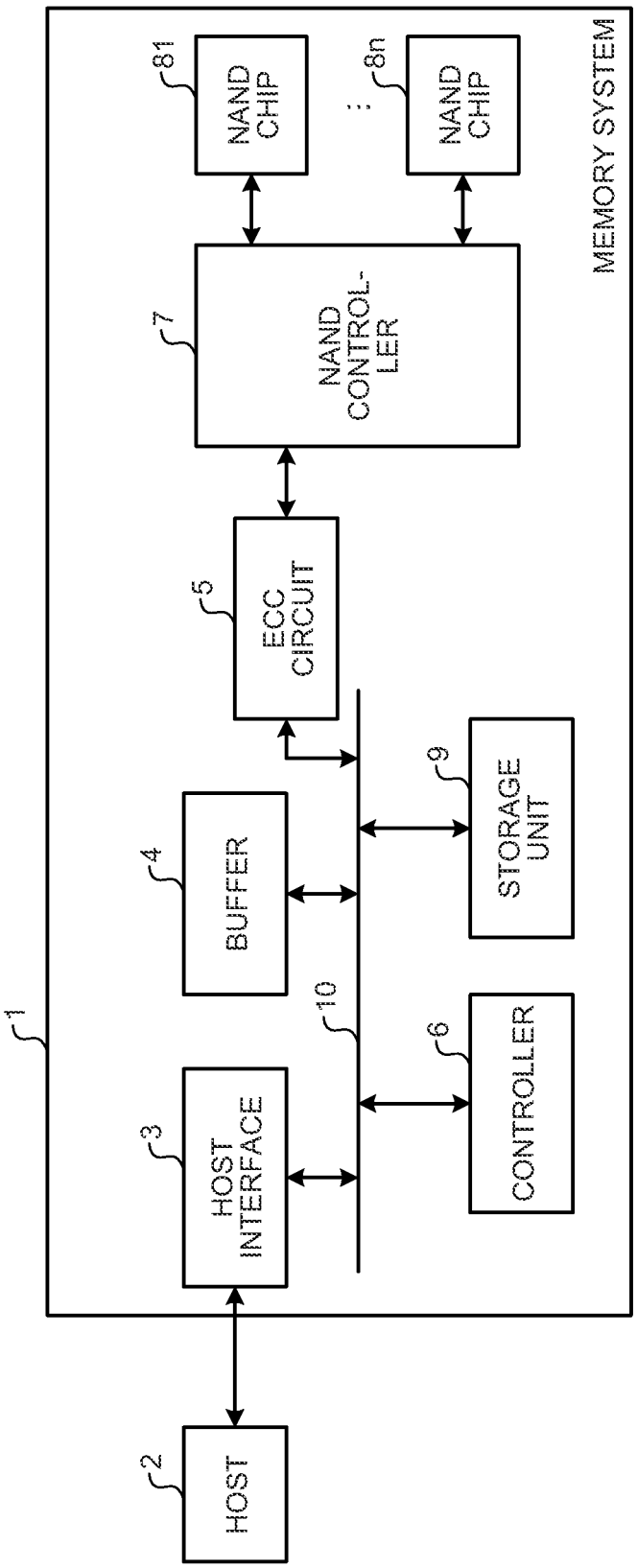
FIG. 1 is a diagram illustrating a configuration of a memory system according to this embodiment.

FIG. 1 is a diagram illustrating a configuration of a memory system 1 according to this embodiment. The memory system 1 includes a controller (changing unit) 6 such as a CPU, a host interface 3, a buffer 4, a storage unit 9, an ECC circuit (encoding unit, decoding unit) 5, NAND chips (memory chips) 81 to 8n, and a NAND controller (interface unit) 7. The host interface 3 receives a command from a host 2. The buffer 4 temporarily holds data. The storage unit 9 holds a counter value described later. The ECC circuit 5 executes an error correcting code (ECC) process (encoding) on user data to convert this data into encoded data with larger data volume than that of the user data, and executes error correcting process (decoding) on the encoded data. The NAND controller 7 controls the NAND chips 81 to 8n. The controller 6, the host interface 3, the buffer 4, the storage unit 9, and the ECC circuit 5 are coupled to one another via a bus 10.

Figure 2:
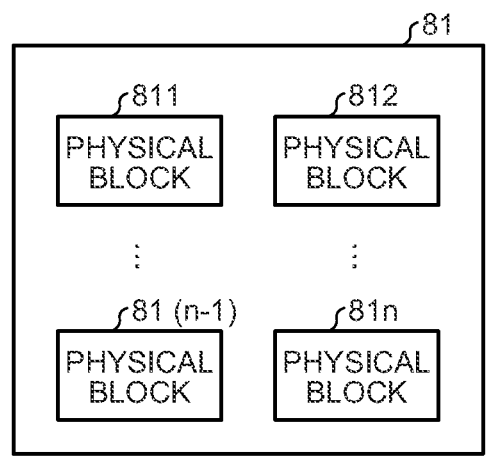
FIG. 2 is a diagram illustrating a configuration of a NAND chip according to this embodiment.
Figure 3:
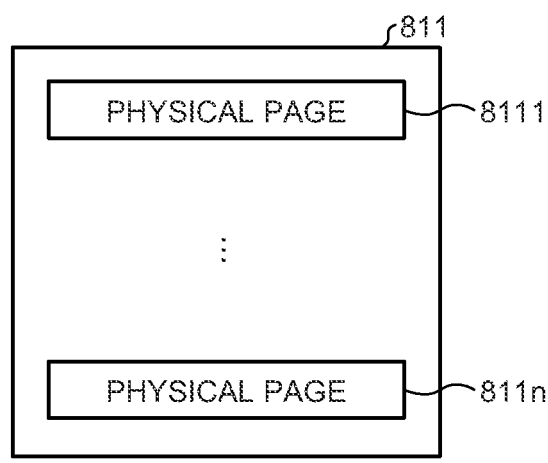
FIG. 3 is a diagram illustrating a configuration of a physical block according to this embodiment.

Each of the NAND chips 81 to 8n includes a plurality of physical blocks as the unit of erasure. For example, taking the NAND chip 81 as an example, as illustrated in FIG. 2, the NAND chip 81 includes physical blocks 811, 812, . . . 81(n−1), and 81n. Additionally, each physical block includes a plurality of physical pages as the unit of writing. For example, taking the physical block 811 as an example, as illustrated in FIG. 3, the physical block 811 includes physical pages 8111, . . . , 811n.

In the memory system 1, repetitive rewriting including erasure of the physical block causes the memory cells of the NAND chips 81 to 8n to be physically worn out. Specifically, rewriting is repeated so as to repeat forcing the electrons in and out via a tunnel oxide film of the memory cell. This causes the reduction in insulation performance of the tunnel oxide film so as to increase the leakage of the electrons within the floating gate. As the leakage of the electrons increases, the probability of occurrence of the read error increases. This tendency is similar to the tendency even after the error-correction coding process is executed on the user data to convert the data into the encoded data. In contrast, it is possible to increase the data volume of the encoded data relatively to the data volume of the user data. Specifically, for the physical page in which the data volume of the write area is determined to have a constant value, under the condition where the data volume of the encoded data is equal to (or less than) the data volume of the physical page, it is possible to execute writing in a state where the data volume of the user data before conversion is reduced while the ratio of the data volume of the encoded data to the user data is increased within each physical page, that is, in a state where the data volume of the encoded data is increased relatively to the data volume of the user data.

Methods for performing writing while increasing the data volume of the encoded data relatively to the data volume of the user data in the case where the reliability of the data retention performance of the NAND chips 81 to 8n is reduced so as to improve the error-correcting performance includes a method in which rewriting of the physical block is preliminarily repeated to cause the physical block to be worn out and then the tendency of a bit error rate (BER) during data read is measured. Subsequently, depending on the predetermined timing of the number rewriting or similar parameter based on the measurement result, it may be determined that the data volume of the encoded data is increased relatively to the data volume of the user data during the operation. Additionally, it may be determined that the bit error rate (BER) is measured during the operation of the memory system 1 and the data volume of the encoded data is increased relatively to the data volume of the user data when the measured value exceeds the constant value. Additionally, in the case where the bit error rate (BER) varies, it may be determined that the usage data for the NAND chips 81 to 8n is held and analyzed in chronological order and then the data volume of the encoded data is increased relatively to the data volume of the user data based on the analysis result.

In the following description, a description will be given of a simple method for increasing the data volume of the encoded data relatively to the data volume of the user data in the case where the memory cell is physically worn out, using a flowchart of FIG. 4.

Figure 5:
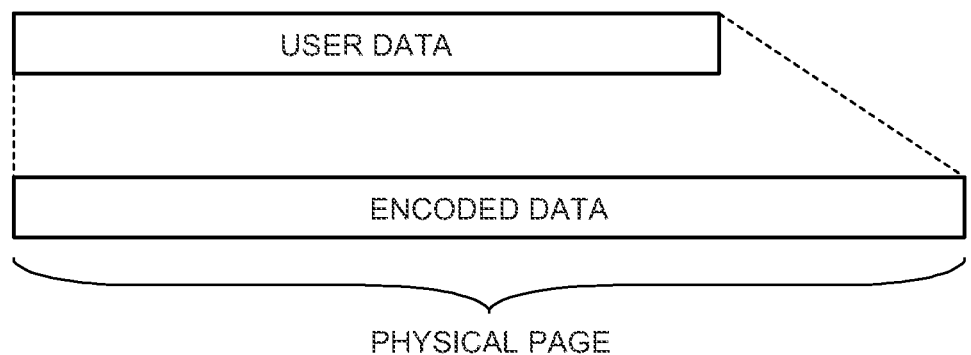
FIG. 5 is a diagram illustrating the encoded data within a physical page according to this embodiment.
Figure 6:
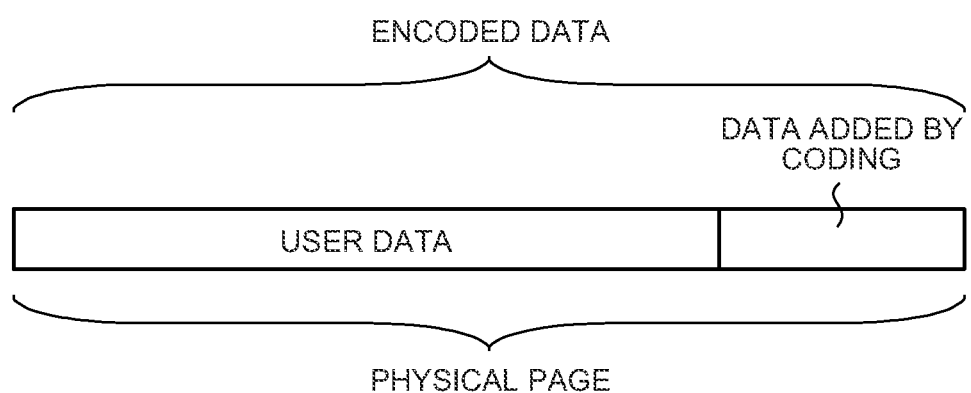
FIG. 6 is another diagram illustrating the encoded data within the physical page according to this embodiment.

Firstly, data read within the physical blocks of the NAND chips 81 to 8n is started (in step S101). While the description will proceed regarding one physical block as an example here, the area that includes a plurality of physical blocks or the NAND chip may be targeted as described later. The error correcting process (decoding) is executed on read data by the ECC circuit 5 through the NAND controller 7. As illustrated in FIG. 5, in the physical page within the physical block, the user data is stored as the encoded data with a larger data volume compared with the user data converted by the ECC circuit 5. Accordingly, as illustrated in FIG. 5, the data volume of the encoded data coincides with the capacity of the physical page. Regarding an error correcting code system, in the case where a low-density parity-check code (LDPC code) or similar code is used, the encoded data is considered to be stored as illustrated in FIG. 5. However, regarding the error correcting code system, in the case where a BCH code or similar code is used, as illustrated in FIG. 6, the encoded data is considered to be stored in a format where the data added by coding is added to the user data before coding. In both codes, the fact remains that the data volume of the data after coding on the user data. In this embodiment, it is assumed that the error correcting code can be used for restoring the error occurring in the user data to some extent of the number of bits. The coding system for the error correcting code is not limited. The controller 6 determines whether or not a bit error occurs in this error correcting process (in step S102). In the case where the bit error has occurred (Yes in step S102), the process proceeds to step S103. In the case where the bit error has not occurred (No in step S102), the reading process on the current physical block is terminated.

Figure 7:
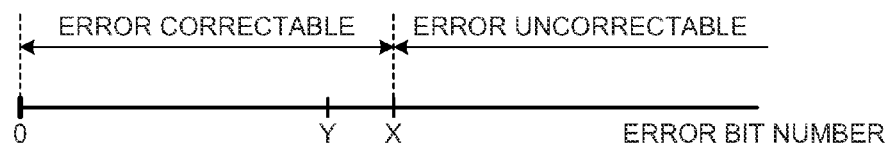
FIG. 7 is a diagram for describing the threshold bit number and the number of bits that allows error correction according to this embodiment.

In step S103, the controller 6 determines whether or not the error bit number in the bit error that has occurred exceeds a predetermined threshold value of Y bits (bit threshold value) as illustrated in FIG. 7. As illustrated in FIG. 7, the error bit number that allows the error correction of the ECC circuit 5 is X bits. That is, in the case where the error bit number in one error correcting process by the ECC circuit 5 is equal to or less than X bits, the error correction successful. In contrast, in the case where the error bit number exceeds X bits, the error correction fails. The above-described threshold value of Y bits is set to, for example, the value equal to or less than X bits. The threshold value of Y bits is set as an index for determining that the worn-out (deterioration) of the memory cell within the current physical block is considerably large even when the error correction is possible in the case where the bit error has occurred beyond Y bits. Since the value of Y is determined for this purpose, the value of Y can take a value from 1 bit to X bits. In the case where the error bit number exceeds Y (Yes in step S103), the process proceeds to step S104. In the case where the error bit number does not exceed Y (No in step S103), the current reading process on this physical block is terminated.

In step S104, the number of occurrences of the phenomenon in which the error bit number exceeds Y from the last block erasure of the current physical block to the subsequent block erasure is taken into consideration. It is conceivable that the memory cell is worn out in a part of the physical block, and once the bit error starts to occur due to reading an area including this part, the same phenomenon occurs every time this area is read. Therefore, it is meaningless to keep counting the number of phenomena in which the error bit number exceeds Y from the last block erasure to the subsequent block erasure for each reading as the action for measuring the degree of the worn-out state of the memory cell. Accordingly, the number of conditions corresponding to "Yes" in step S103 due to the state where the error bit number exceeds Y from the last block erasure to the subsequent block erasure is measured by disposing a counter (second counter) in, for example, the storage unit 9 within the memory system 1. This counter is disposed for each physical block, and is reset to zero in the subsequent block erasure. Subsequently, in step S104, the controller 6 determines whether or not this number is equal to or less than B. Here, B (second threshold value) is the number equal to or less than A (first threshold value) described later. It may be determined whether or not, for example, B =1, that is, the phenomenon in which the error bit number exceeds Y from the last block erasure to the subsequent block erasure occurs one time. In the case where the number of conditions in which the error bit number exceeds Y from the last block erasure to the subsequent block erasure is equal to or less than B (Yes in S104), the process proceeds to step S105. In the case where the number of conditions in which the error bit number exceeds Y exceeds B (No in step S104), the count-up in step S105 is not executed.

In step S105, the controller 6 counts up the number Z of phenomena in which the error bit number exceeds Y in this physical block by one so as to set Z=Z+1. The counter (first counter) for counting Z is disposed, for example, in the storage unit 9 for each physical block in the memory system 1. Here, as described later, in the case where this flowchart is executed by a unit of a plurality of physical blocks or a unit of a NAND chip, the counter for counting Z is disposed every plurality of physical blocks or every NAND chip. Subsequently, in step S106, it is determined whether or not Z exceeds a predetermined threshold number A. In the case where Z exceeds A (Yes in S106), the process proceeds to step S107. In the case where Z does not exceed A (No in step S106), it is determined that this physical block is not worn out much and reading of this physical block is terminated.

Figure 8:
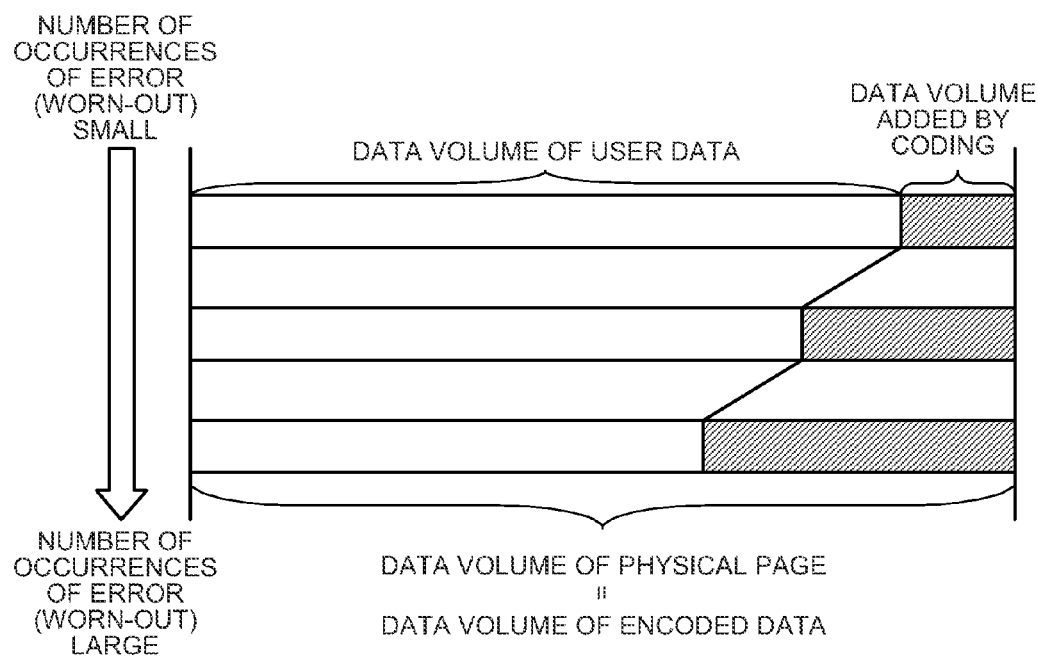
FIG. 8 is a diagram illustrating a state where the data volume of the encoded data is being increased relatively to the data volume of the user data in this embodiment.

In the case where Z exceeds A (Yes in S106), this physical block is considered to be becoming worn out. In the physical page within the current physical block, as illustrated in FIG. 8, it is determined to increase the ratio of the data volume of the encoded data to the data volume of the user data (in step S107). Since the data volume of the encoded data within the physical page corresponds to the data volume of the physical page, the data volume of the encoded data is constant. Therefore, increasing the ratio of the data volume of the encoded data to the data volume of the user data means reducing the data volume of the user data before coding compared with that before the above-described determination while maintaining the same data volume of the encoded data. While the data volume of the encoded data does not necessarily coincide with the data volume of the physical page, the data volume of the encoded data cannot exceed the data volume of the physical page. In the case where the encoded data is stored in the physical page in the format as illustrated in FIG. 6, it is possible to increase the ratio of the data volume of the encoded data to the data volume of the user data by reducing the data volume of the user data so as to increase the data volume of the data added by coding. However, the increased amount in data volume of the data added by coding may be increased, for example, by a unit of a cluster smaller than the physical page. In the writing after the first block is erased after the determination of increasing the ratio of the data volume of the encoded data to the data volume of the user data in step S107, the ECC circuit 5 converts the user data into the encoded data at the determined ratio of the data volume of the encoded data to the data volume of the user data in step S107. This encoded data is written to the physical page.

After step S107, Z is reset as Z=0 (in step S108). Afterward, the flowchart in FIG. 4 is executed again during this reading of the block. Once the ratio of the data volume of the encoded data to the user data is increased in step S107, for example, Y used in step S103, B used in step S104, A used in step S106, and the next increased amount of the data volume of the data added by coding may have the same values, or a part of these values or all of these values may be changed.

Figure 4:
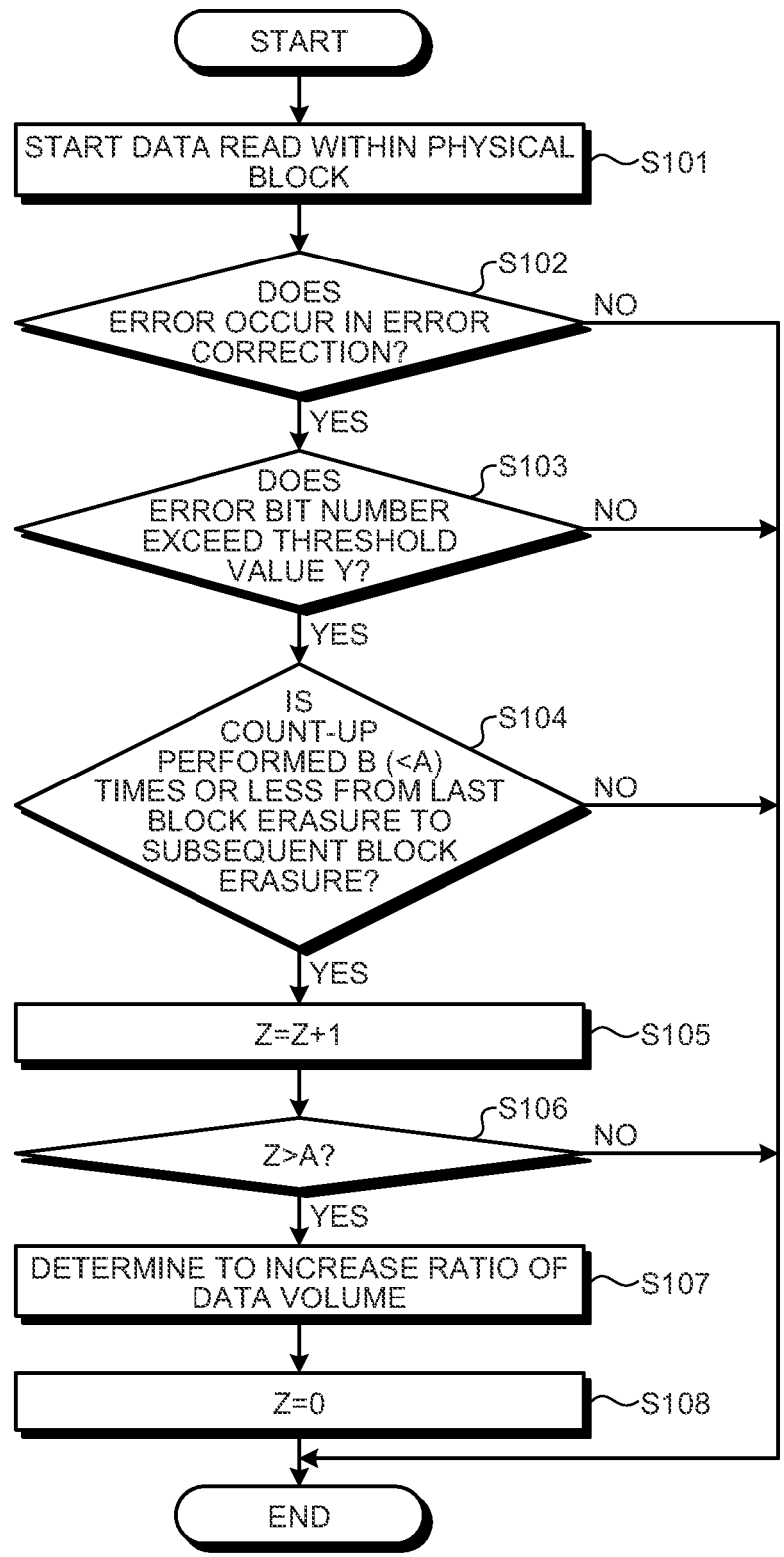
FIG. 4 is a flowchart for describing an algorithm for determining to increase data volume of encoded data according to this embodiment.

In the above description, it is determined to increase the ratio of the data volume of the encoded data to the user data by reading by a unit of the physical block using the flowchart in FIG. 4. The controller 6 may be configured so as to increase the ratio of the data volume of the encoded data to the user data written in a second storage area according to an error correction result of a first storage area. The first storage area is the same storage area as the second storage area, or is a storage area included in the second storage area. The first storage area and the second storage area are one physical block, a plurality of physical blocks, or a NAND chip including a plurality of physical blocks. For example, in a plurality of physical blocks or a NAND chip that includes a plurality of physical blocks, it may be determined to increase the above-described ratio of the data volume by executing an algorithm similar to that in FIG. 4. In this case, for example, the unit for counting the error bit number in step S103 is the area that includes the plurality of physical blocks or the NAND chip. As described above, increasing the above-described ratio of the data volume based on the result of error correction on one physical block allows a detailed increase of the ratio of the data volume corresponding to the degree of the worn-out state every physical block. Additionally, if it is determined to increase the above-described ratio of the data volume based on the result of error correction on a collection of a plurality of physical blocks, for example, a NAND chip, it is only necessary to dispose the counter (first counter) every plurality of physical blocks or every NAND chip without disposing the counter (first counter) for counting Z every physical block. This is considered to realize facilitation of the control or similar advantage. Additionally, one physical block within the NAND chip is set as a physical block of a monitoring target, the counter (first counter) is disposed alone in this physical block, the flowchart in FIG. 4 is executed, and a target for increasing the ratio of the data volume of the encoded data to the user data is set to a plurality of physical blocks or a NAND chip that includes this physical block. This configuration allows realizing appropriate error correction corresponding to the degree of a physically worn-out state of the non-volatile storage unit with a simple control similarly. Thus, there are a lot of possible variations of the installation unit of the counter (first counter) as described above.

On the other hand, the counter (second counter), which counts the number of the state where "Yes" is determined in step S103 because the error bit number exceeds Y from the last block erasure to the subsequent block erasure, is basically disposed every physical block. This is because this counter (second counter) is for counting duplication of errors by reading the same portion within the physical block. However, for example, in the case where B (second threshold value) is set to one, this counter is not necessarily disposed every physical block. This counter may be disposed for each unit of a plurality of physical blocks.

Based on the result of error correction during reading by a unit of a predetermined area, for example, reading by a plane unit that is the maximum unit for performing reading operation or writing operation at once, the above-described ratio of the data volume may be increased.

Figure 9:
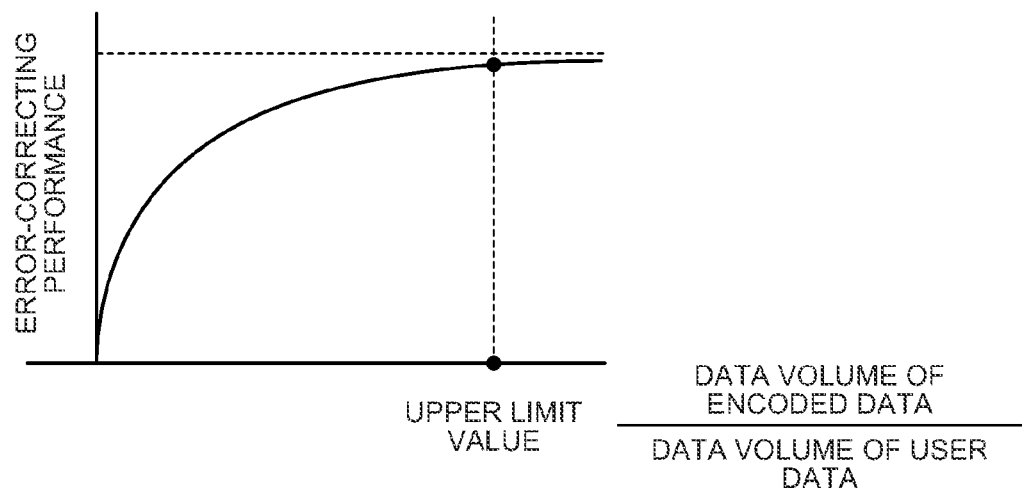
FIG. 9 is a diagram illustrating a change in error-correcting performance in the case where the data volume of the encoded data is increased with respect to the data volume of the user data according to this embodiment.

In the case where the ratio of the data volume of the encoded data to the user data is increased, the error-correcting performance has a tendency to be gradually saturated to the upper limit value as illustrated in FIG. 9. Accordingly, the above-described increase in ratio of the data volume may be stopped before the error-correcting performance is saturated. Specifically, the upper limit value of the ratio of the data volume of the encoded data to the user data or the upper limit value of the data volume of the data added to the user data by coding within the physical page is determined in advance. When the ratio of the data volume of the encoded data to the user data or the data volume of the data added by coding within the physical page reaches this value, the increase in ratio of the data volume of the encoded data to the user data may be stopped at the upper limit value in FIG. 9 or the increase in data volume of the data added by coding may be stopped at the upper limit value. This method for determining the upper limit value of the ratio of the data volume of the encoded data to the user data and the upper limit value of the data volume of the data added to the user data by coding can perform setting according to the criteria that, for example, the data volume added by coding in FIG. 8 does not exceed half of the data volume of the physical page. In this case, the upper limit value of the ratio of the data volume of the encoded data to the user data is two. The upper limit value of the data volume of the data added to the user data by coding is equal to half of the data volume of the physical page. The configuration that the upper limit value of the ratio of the data volume of the encoded data to the user data or the upper limit value of the data volume of the data added to the user data by coding within the physical page is determined in advance is included in the concept that the lower limit value of the data volume of the user data (user data before coding) stored in a unit area with a predetermined size is determined in advance. This is because the controller 6 increases the ratio of the data volume of the encoded data to the user data or increases the data volume of the data added to the user data by coding within the physical page by reducing the data volume of the user data before coding stored in the unit area. In addition, while the physical page is employed as an example of the unit area herein, an arbitrary unit other than the physical page may be employed as the unit area. For example, a physical block, a physical block set, a physical page set, or the like may be employed as the unit area. The physical block set and the physical page set will be described later.

Figure 10:
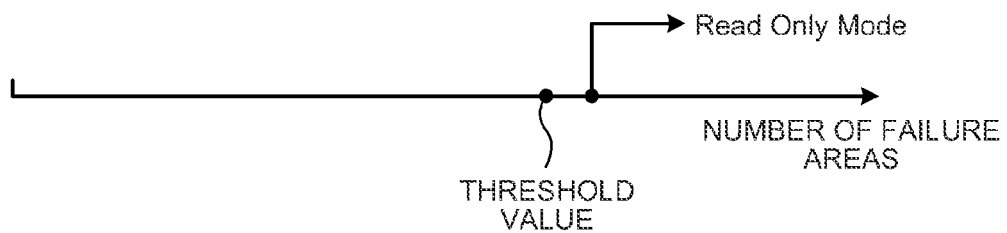
FIG. 10 is a diagram for describing a condition in which the increase in data volume of the encoded data with respect to the user data is stopped before a Read Only mode is set in this embodiment.

When the memory cell is becoming physically worn out, a physical block (failure block) that cannot be used as a storage area due to reasons such as a lot of read errors, an area (failure area) that is unavailable for reading or writing, or similar area may occur. Here, the area that has been unavailable for writing is defined as a failure area. In the case where the number of failure blocks or the number of failure areas exceeds the upper limit value, a new failure block or a new failure area cannot be registered. Thus, it is impossible to ensure writing both of the data stored in the cache memory or similar memory in the memory system and the data requested to be written, into the NAND chips 8$_1$ to 8$n$. Accordingly, in the case where the failure block number or the failure area number exceeds a predetermined value, a problem arises in that writing of data suddenly becomes impossible even though there is free capacity in the NAND chips 8$_1$ to 8$n$. Thus, there is a memory system that has an operating mode that stops writing and only allows reading as illustrated in FIG. 10 as a Read Only mode in the case where the number of failure physical blocks or the number of failure areas in each management unit in a NAND chip exceeds a predetermined value. In this memory system, a threshold value (failure-area threshold value) is set to the failure area number before the Read Only mode is set as illustrated in FIG. 10. In the case where the failure area number exceeds this threshold value, the increase in ratio of the data volume of the encoded data to the user data or the increase in data volume of the data added to the user data by coding may be stopped. It is effective to count the failure area by a unit of an area smaller than the physical block, as the criteria for determining that the Read Only mode is set by a unit of this physical block or a larger unit. For example, this is effective when the operating mode is changed by a unit of the physical block. It is effective to count the failure area by a unit of the physical block, as the criteria for determining the Read Only mode is set by a unit of the collection of a plurality of physical blocks or a larger unit of a NAND chip. For example, this is effective when the operating mode is changed by a unit of the area formed of the plurality of physical blocks or a unit of the NAND chip.

The unit for calculating the number of failure areas is not limited to a unit of the physical block, and may be a unit of the page that is the unit of writing or a smaller unit. The unit for counting the failure area number can employ various units including a unit of, for example, a physical block, a plurality of physical blocks, or a NAND chip that includes a plurality of physical blocks. Accordingly, both the unit for counting the error bit number and the unit for counting the failure area number may employ the same unit of the physical block, the plurality of physical blocks, or the NAND chip that includes the plurality of physical blocks. Additionally, the unit for counting the error bit number may correspond to the physical block, the plurality of physical blocks, or the NAND chip that includes the plurality of physical blocks while the unit for counting the failure area number as the criteria for determining that the Read Only mode is set corresponds to the overall NAND chip.

The obtained error bit number in step S103 may be, for example, integrated for each physical block, plurality of physical blocks, or NAND chip, so as to use the total number as the criteria for determining to increase the data volume in ECC.

With this embodiment, the data volume of the error correcting code is changed depending on the degree of the worn-out state of the non-volatile memory to execute writing of data. For example, based on the error bit number in the error correction, the data volume of the error correcting code is increased for writing data. As a result, it is possible to obtain the effect that can realize appropriate error correction corresponding to the degree of the worn-out state of the non-volatile memory with the simple method.

The controller 6 is described to have a function as a changing unit which reduces the data volume of the user data before coding stored in the unit area according to the error bit number detected by the ECC circuit 5. Some or all of the functions as the changing unit can be realized by hardware or by a combination of hardware and software. For example, various counter operations may be executed by hardware. In addition, as described to be performed by the ECC circuit 5, the function as the decoding unit that detects the error bit number may be realized by the controller 6. In addition, the function as the decoding unit may be realized by a combination of software and hardware. Similarly, as described to be performed by the NAND controller 7, the function of storing data in NAND chips 8$_1$ to 8$n$ or reading data from the NAND chips 8$_1$ to 8$n$ may be realized by software or by a combination of software and hardware. In addition, although the ECC circuit 5 is described to function as the decoding unit and to function as the encoding unit that encodes data, the ECC circuit 5 may be realized by a circuit having a function different from the function as the decoding unit and the function as the encoding unit. In addition, the function as the encoding unit may be realized by software or by a combination of software and hardware. In addition, the function of prohibiting external writing according to the number of failure areas may be realized by software or by hardware or by a combination of software and hardware.

(Second Embodiment)

Figure 11:
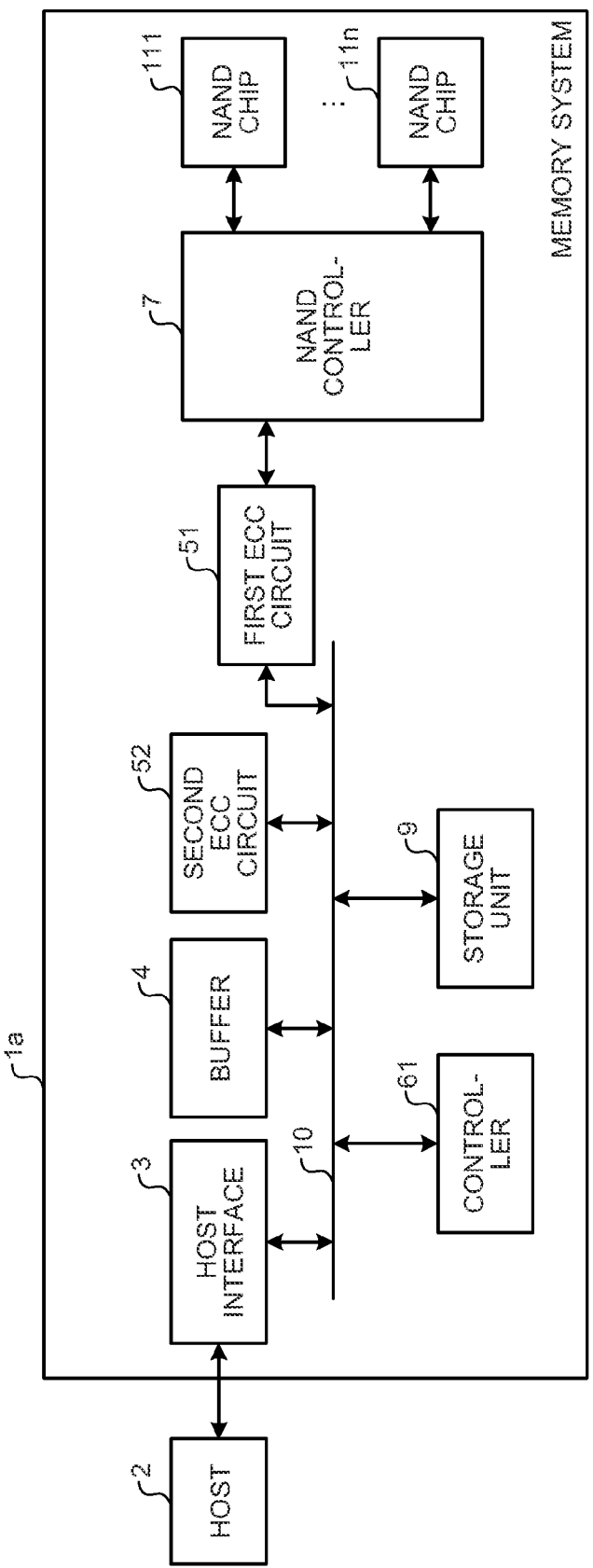
FIG. 11 is a diagram illustrating a configuration of a memory system according to a second embodiment.

FIG. 11 is a diagram illustrating a configuration of a memory system 1$a$ according to a second embodiment. The same components as those of the first embodiment are denoted by the same reference numerals and names, and the redundant description is not presented. The memory system 1$a$ includes a controller 61, a host interface 3, a buffer 4, a storage unit 9, a first ECC circuit 51, a second ECC circuit 52, NAND chips 11$_1$ to 11$n$, and a NAND controller 7 that controls the NAND chips 11$_1$ to 11$n$. The controller 61, the host interface 3, the buffer 4, the storage unit 9, the first ECC circuit 51, and the second ECC circuit 52 are coupled to one another via a bus 10.

The NAND chips 11$_1$ to 11$n$ have the same configuration. Hereinafter, sometimes, the NAND chips 11$_1$ to 11$n$ are collectively referred to as a NAND chip 11.

Figure 12:
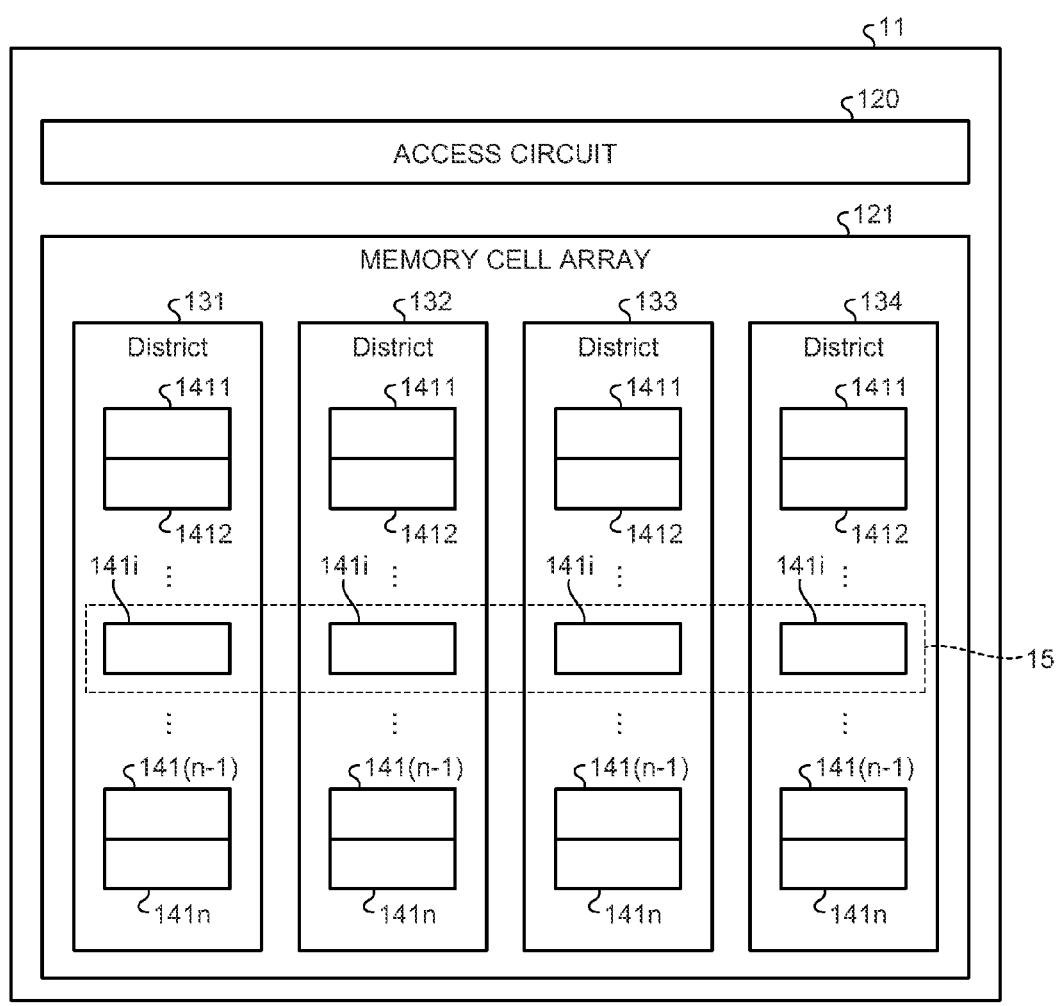
FIG. 12 is a diagram illustrating a configuration of one NAND chip.

FIG. 12 is a diagram illustrating a configuration of one NAND chip 11. The NAND chip 11 includes an access circuit 120 and a memory cell array 121. The access circuit 120 includes a voltage generating circuit, a row decoder, a column decoder, a data cache, and a sense amplifier. The access circuit 120 can perform accessing (programming, reading, erasing) on the memory cell array 121. The memory cell array 121 is divided into a plurality (herein, four) of Districts 131 to 134 which can be simultaneously accessed by the access circuit 120. Each of the Districts 131 to 134 includes physical blocks 1411, 1412, . . . 141 (n−1), and 141n. The physical blocks 1411, 1412, . . . 141 (n−1), and 141n have the same configuration. Hereinafter, sometimes, the physical blocks 1411 to 141n are collectively referred to as a physical block 141.

Figure 13:
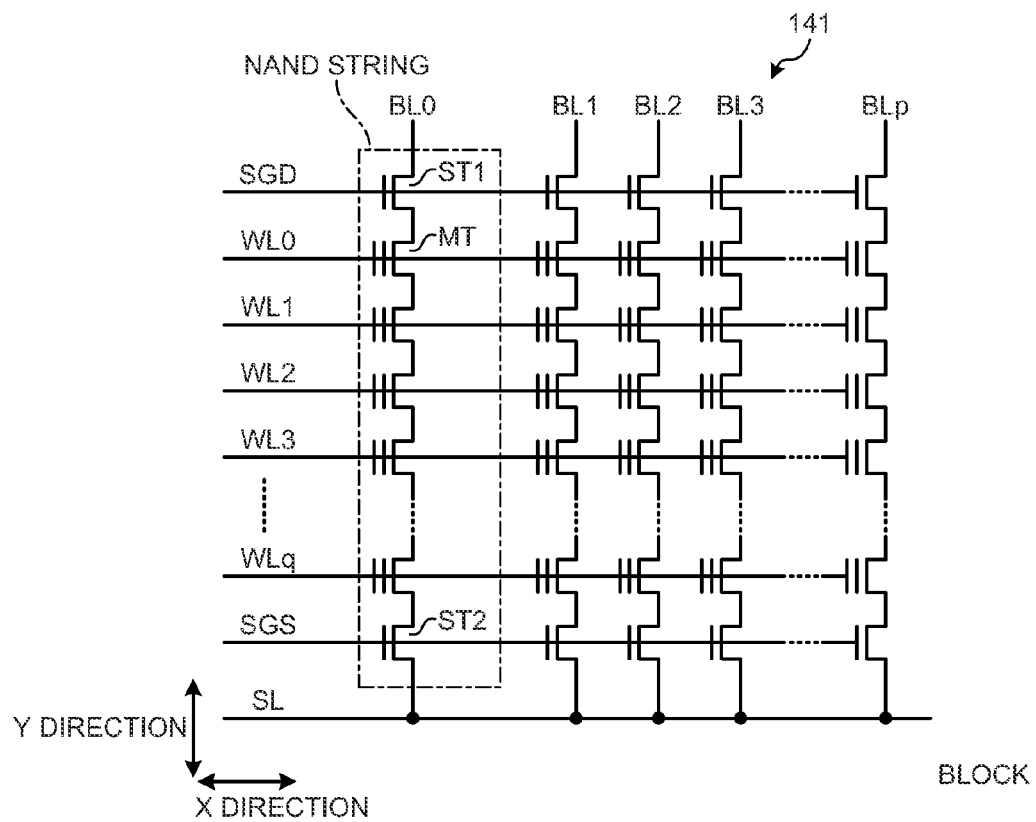
FIG. 13 is a diagram illustrating a configuration of one physical block.

FIG. 13 is a diagram illustrating a configuration of one physical block 141. As illustrated in the figure, the physical block 141 includes (p+1) NAND strings which are arranged in order along the X direction (p is an integer of 0 or more). A drain of a selection transistor ST1 included in each of the (p+1) NAND strings is connected to bit lines BL0 to BLp, and a gate thereof is commonly connected to a selection gate line SGD. A source of a selection transistor ST2 is commonly connected to a source line SL, and a gate thereof is commonly connected to a selection gate line SGS.

Each memory cell transistor MT (memory cell) is configured with a MOSFET (metal oxide semiconductor field effect transistor) having a stacked gate structure formed on a semiconductor substrate. The stacked gate structure includes a floating gate formed through a tunnel oxide film on the semiconductor substrate and a control gate electrode formed through an inter-gate insulating film on the floating gate. A threshold value voltage of the memory cell transistor MT varies according to the number of electrons that can be stored in the floating gate, so that data is stored according to a difference in threshold value voltage. Namely, the memory cell transistor MT holds charges according to the data in the floating gate.

In each NAND string, the (q+1) memory cell transistors MT are disposed between the source of the selection transistor ST1 and the drain of the selection transistor ST2 so that the current paths are serially connected. In order from the memory cell transistor MT located closest to the drain side, the control gate electrodes are connected to word lines WL0 to WLq. Therefore, the drain of the memory cell transistor MT connected to the word line WL0 is connected to the source of the selection transistor ST1, and the source of the memory cell transistor MT connected to the word line WLq is connected to the drain of the selection transistor ST2.

The word lines WL0 to WLq are commonly connected to the control gate electrode of the memory cell transistor MT between the NAND strings within the block. Namely, the control gate electrodes of the memory cell transistors MT located in the same row within the block are connected to the same word line WL. The (p+1) memory cell transistors MT connected to the same word line WL are treated as one physical page, and data programming and data reading are performed for every physical page.

In addition, in the case of employing a storing scheme (two-value storing scheme) of storing multiple bits in one memory cell transistor MT, one word line WL includes a plurality of the physical pages. For example, according to the two-value storing scheme, one of four-value data "yx" defined by the upper page data "x" and the lower page data "y" can be held in the memory cell transistor MT. The four-value data "yx" is allocated, for example, with data "11", "10", "00", and "01" in order of charge amounts stored in the floating gate. The data "11" denotes an erased state.

The order of charge amounts correlated with the respective data is not limited to the above-described order. An arbitrary method of correlating the respective data with the charge amounts so that a Hamming distance between the adjacent data becomes 1 can be employed.

During programming, the access circuit 120 selects the word line of the programming target to activate the selected word line. Next, the access circuit 120 selects the bit line according to the read column address to activate the bit line. The access circuit 120 applies a voltage to the selected bit lines to program the data in the memory cell transistor MT located at the intersection of the selected word line and the selected bit line. Specifically, the access circuit 120 applies a high-voltage programming pulse to the control gate electrode of the memory cell transistor MT through the word line WL until the threshold value voltage reaches a desired value according to the data.

During reading, the access circuit 120 applies a read voltage to the word line WL in order to specify the data ("11", "10", "00", "01") stored in the memory cell transistor.

During erasing, the access circuit 120 applies an erase voltage to the substrate of the memory cell array 121. The access circuit 120 electrically connects all the word lines WL of the physical block 141 to the ground voltage. Therefore, in each memory cell transistor MT within the physical block 141, the charges stored in the floating gate are emitted. As a result, each of the memory cell transistors MT within the physical block 141 is transitioned to the erased state (that is, the state where the data "11" is stored).

Figure 14:
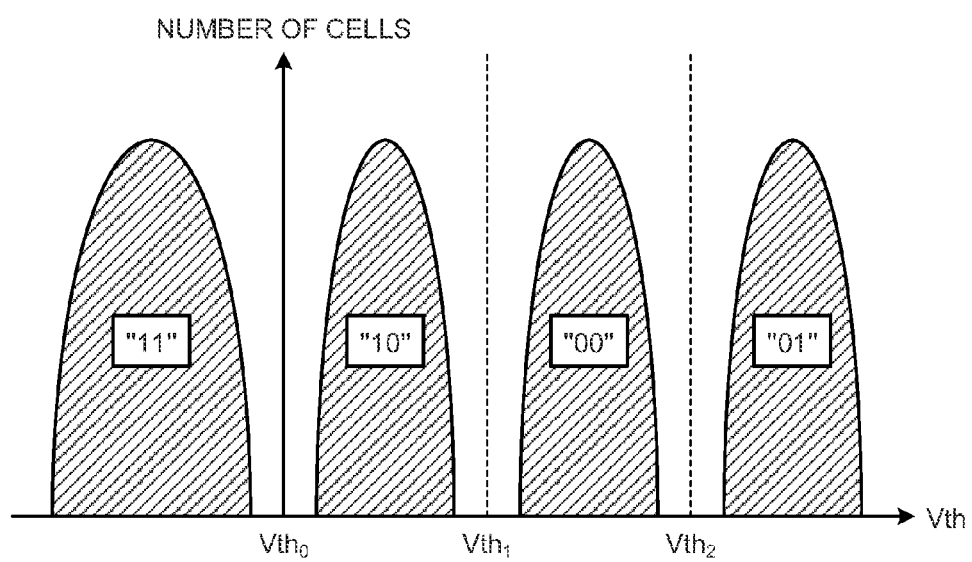
FIG. 14 is a diagram illustrating a relationship between a distribution of threshold values and read voltages.

FIG. 14 is a diagram illustrating a relationship between a distribution of threshold values and read voltages. This figure illustrates the relationship in the case where the two-value storing scheme is employed. The horizontal axis denotes the threshold value voltages, and the vertical axis denotes the number of memory cell transistors MT. As illustrated in the figure, the threshold values allocated to the respective data are actually distributed to ranges having a certain amount of width. During reading, which range the threshold value of the memory cell transistor MT is to belong to is determined based on the comparison of the read voltage set between the respective ranges with the threshold value voltage. For example, the access circuit 120 determines whether the upper page data is "1" or "0" according to whether or not the threshold value voltage of the memory cell transistor MT exists between the read voltage Vth0 and the read voltage Vth2. In the case where the threshold value voltage of the memory cell transistor MT exists between the read voltage Vth0 and the read voltage Vth2, the access circuit 120 determines that the upper page data is "0". In the case where the threshold value voltage of the memory cell transistor MT does not exist between the read voltage Vth0 and the read voltage Vth2, the access circuit 120 determines that the upper page data is "1". In addition, the access circuit 120 determines whether the lower page data is "1" or "0" according to whether the threshold value voltage of the memory cell transistor MT is larger or smaller than the read voltage Vth1. In the case where the threshold value voltage of the memory cell transistor MT is larger than the read voltage Vth1, the access circuit 120 determines that the lower page data is "0". In the case where the threshold value voltage of the memory cell transistor MT is smaller than the read voltage Vth1, the access circuit 120 determines that the lower page data is "1".

In addition, each of the read voltages Vth0 to Vth2 is stored in any one of the storage units within the NAND chip 11. The NAND chip 11 stores initial values of the read voltages Vth0 to Vth2 in advance. In the initial state, the access circuit 120 uses the initial values. The controller 61 can shift the read voltages. In the case where the set values of the read voltages Vth0 to Vth2 are transmitted from the controller 61, the access circuit 120 uses the transmitted set values. In addition, the initial values may be set by the controller 61.

In the NAND chip 11, four physical blocks 141 which belong to different Districts (planes) constitute a physical block set 15. The physical block set 15 is a combination of the four physical blocks 141 that are accessed in parallel. The NAND chip 11 includes a plurality of the physical block sets 15, and any one of the physical blocks 141 included in the NAND chip 11 constitutes any one of the physical block sets 15. The combination of the physical blocks 141 constituting each physical block 141 is determined in advance or dynamically. The combination of the physical blocks 141 constituting each physical block 141 is managed, for example, by the controller 61.

Figure 15:
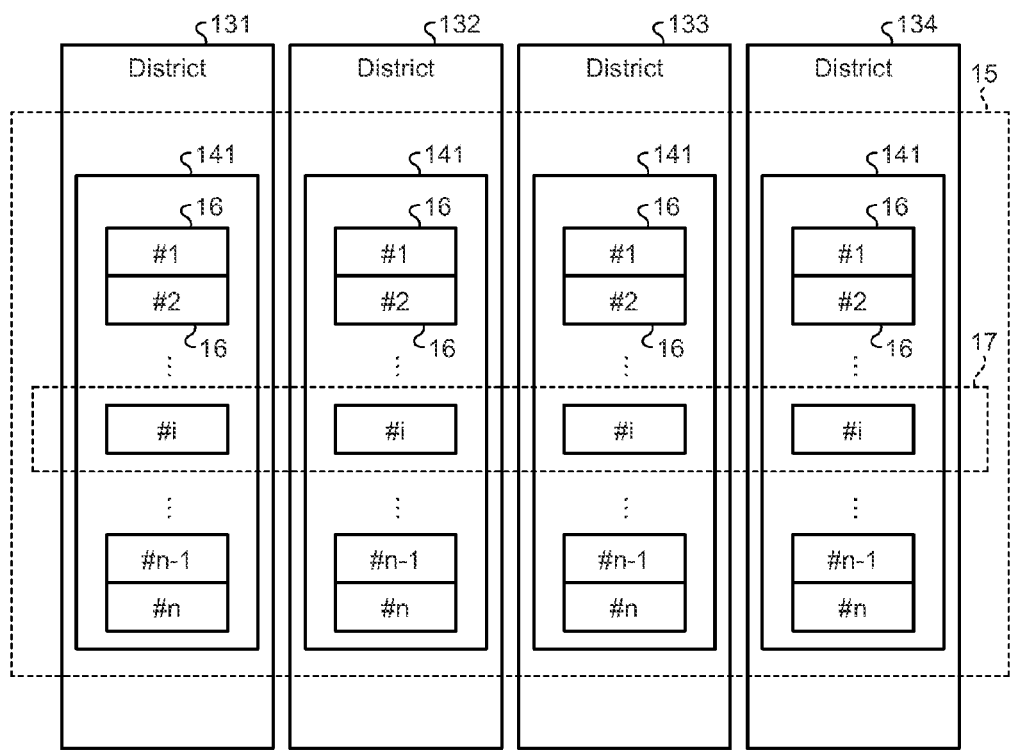
FIG. 15 is a diagram illustrating one physical page set.

FIG. 15 is a diagram illustrating one physical page set. Each physical block 141 includes a plurality of physical pages 16. In each physical block set 15, four physical pages 16 which belong to different physical blocks 141 constitute one physical page set 17. The physical page set 17 is a combination of four physical pages that are read in parallel and programmed in parallel. Each physical block set 15 includes a plurality of the physical page sets 17. For example, the i-th physical page from the front included in each of the physical blocks 141 constituting one physical block set 15 constitutes one physical page set 17.

The first ECC circuit 51 performs encoding and decoding of the first error correction code. As the first error correction code, an error correction code of which the strength of the error-correcting performance is variable is employed. As an example of the error correction code of which the strength of the error-correcting performance is variable, variable-length coding such as a bose chaudhuri hocqenghem (BCH) code can be employed.

Figure 16:
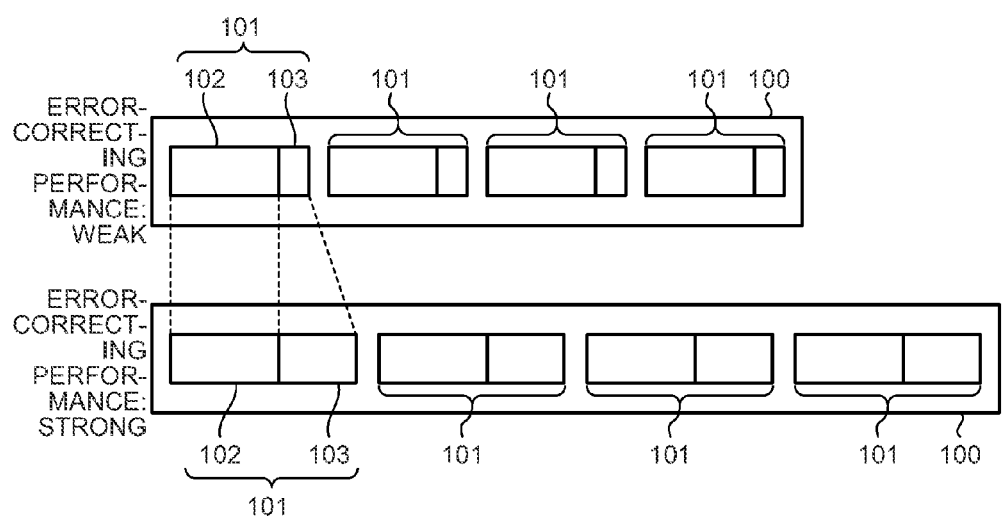
FIG. 16 is a diagram for describing an error correction frame by a first ECC circuit.

FIG. 16 is diagram for describing an error correction frame (hereinafter, simply, referred to as a frame) by the first ECC circuit 51. The figure illustrates frames as the encoded data. As illustrated in the figure, one cluster 100 includes four frames 101. Each frame 101 includes user data 102 and a first error correction code 103 generated by encoding the user data 102 by the first ECC circuit 51. The user data 102 may be the same as the user data before coding or may be the user data obtained by arbitrary conversion such as compression of the user data before coding. Herein, the size of the user data 102 is a predetermined fixed size, and the user data 102 is the same as the user data before coding. In the case where the strength of the error-correcting performance is set to be weak and in the case where the strength of the error-correcting performance is set to be strong, the size of the user data 102 is not changed. The size of the first error correction code 103 of the case where the strength of the error-correcting performance is set to be strong is larger than that of the case where the strength of the error-correcting performance is set to be weak. Therefore, as the strength of the error-correcting performance becomes strong, the size of the cluster 100 is increased.

Figure 17:
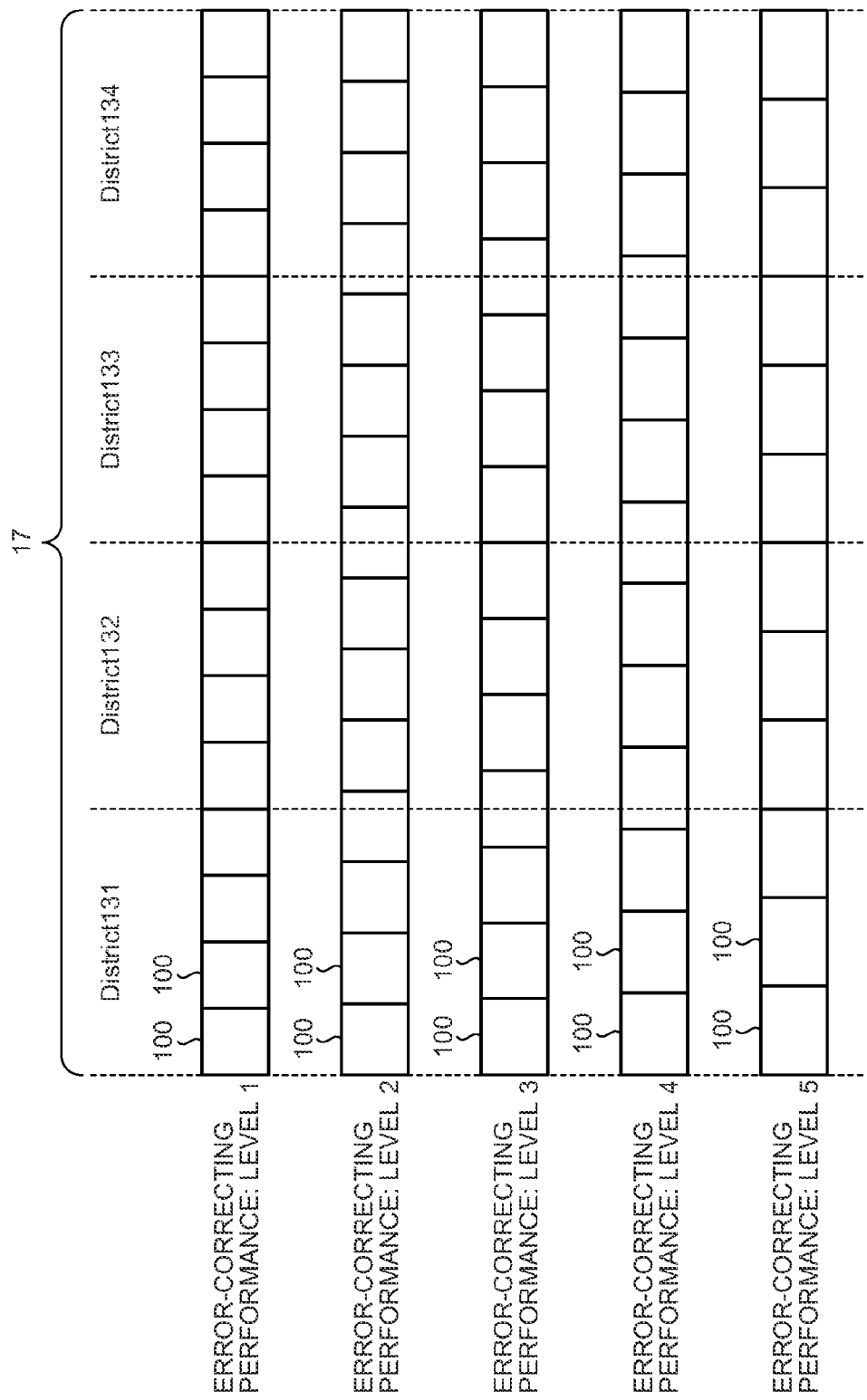
FIG. 17 is a diagram illustrating an example of arrangement of clusters with respect to physical page sets.

FIG. 17 is a diagram illustrating an example of arrangement of the clusters 100 with respect to the physical page sets 17 for every error-correcting performance. This figure illustrates an example of arrangement where a first level is set to the uppermost end and illustrates examples of arrangement where second, third, fourth, and fifth levels are set in the downward direction in this order. The strength of the error-correcting performance is defined to be high as the level is high. As illustrated in the figure, in the case of the first level, 16 frames 200 are stored in one physical page set 17. In the case of the second level, 15 frames 200 are stored in one physical page set 17. In the case of the third level, 14 frames 200 are stored in one physical page set 17. In the case of the fourth level, 13 frames 200 are stored in one physical page set 17. In the case of the fifth level, 12 frames 200 are stored in one physical page set 17. In this manner, in the second embodiment, as the error-correcting performance of the error correction coding process executed by the first ECC circuit 51 is high, the number of clusters that can be stored in one physical page set 17 becomes small. As the error-correcting performance set in the first ECC circuit 51 is high, the data volume (size) of the user data before coding that can be written in the unit area (herein, one physical page set 17 as an example) becomes small. Namely, the increasing of the correcting performance of the first ECC circuit 51 is the same as the decreasing of the data volume of the user data before coding stored in the unit area.

The second ECC circuit 52 performs encoding and decoding of the second error correction code. The second error correction code is, for example, an RS (Reed Solomon) code. The error-correcting performance of the second error correction code is set to be higher than the error-correcting performance of the first error correction code. For example, the second ECC circuit 52 performs encoding of the respective data written in the different NAND chips 11.

In the memory system 1a, due to leakage of electrons of the floating gates in the NAND chip 11 or the like, the threshold value distribution after programming is changed as the time elapses. In addition, if the memory cell is worn out, the speed of change of the threshold value distribution has a tendency to be accelerated. In addition, there is a case where the speeds of worn-out of the memory cells are different due to manufacturing variation of the NAND chip 11. As the threshold value distribution is changed, the user data 102 is changed.

The controller 61 copes with the change of the user data 102 caused by changing the threshold value distribution by using the error correction and the shifting of the read voltage. Specifically, in the case where the first ECC circuit 51 fails in the error correction, the controller 61 shifts the read voltage according to a predetermined method and causes the NAND chip 11 to perform reading again. In addition, in the case where the first ECC circuit 51 fails in the error correction although the read voltage is shifted to a predetermined maximum value, the controller 61 causes the second ECC circuit 52 to execute the error correction.

If the changed amount of the threshold value distribution of the physical block 141 exceeds the limit that the controller can cope with by the shifting of the read voltage, the error correction of the first ECC circuit 51, and the error correction of the second ECC circuit 52, the data stored in the physical block 141 cannot be restored. Before the changed amount of the threshold value distribution of the physical block 141 exceeds the limit, the controller 61 refreshes the data stored in the physical block 141. The refreshing denotes copying at least all the effective user data 102 among the data stored in the physical block 141 to another physical block 141 and erasing the entire data stored in the physical block 141 as the copying source. In addition, the physical block 141 as the moving source and the physical block 141 as the moving destination may be the same. In the case where the physical block 141 as the moving source and the physical block 141 as the moving destination are the same, at least all the effective user data 102 stored in the physical block 141 as the target is read, for example, to the buffer 4, the entire data stored in the physical block 141 as the target is erased, and the data read to the buffer 4 is written in the physical block 141 as the target after the erasure.

Herein, the controller 61 performs refreshing on the physical block 141 in units of a physical block set 15. In addition, hereinafter, the phrase "refreshing on the physical block set 15" denotes the performing the refreshing by using the physical block set 15 as the copying source.

The controller 61 performs refreshing according to the following two methods.

The first method (first process) is a method of performing the refreshing according to the time elapsing from the programming. For example, the controller 61 measures the time elapsing from the start of the programming after the erasure for every physical block set 15 and performs refreshing on the physical block set 15 of which the elapsing time reaches a predetermined time T1. T1 may be a fixed value or may be dynamically calculated based on a function having an arbitrary parameter by the controller 61 or the like. For example, the function for calculating T1 may have ambient temperature or an index (for example, the number of times of rewriting) representing a degree of worn-out of the memory cell as the parameter.

The second method (second process) is a method of detecting the physical block set 15 and performing the refreshing on the detected physical block set 15. For example, with respect to the physical block set 15 where a speed of leakage of electrons is particularly fast or a frequency of reading or programming is particularly high, the refreshing by the first process is also performed at an early timing, so that there is a possibility that the changed amount of the threshold value distribution reaches a limit. The controller 61 detects the physical block set 15 as the refreshing target.

In addition, when the controller 61 detects the physical block set 15 as the refreshing target by the second process, the controller determines to change the level of the error correction of the physical block set 15 into a stronger level. The change of the level of the strength of the error correction is applied after the erasure.

In addition, the controller 61 determines the changed amount of the threshold value distribution based on the shifted amount from the initial value of the read voltage of the time of succeeding in the error correction.

In a storing scheme of performing storing 1 bit in one memory cell transistor MT, one read voltage is used. In this case, the controller 61 may determine the changed amount of the threshold value distribution from the shifted amount from the initial value of the one read voltage. In a storing scheme of performing storing multiple bits in one memory cell transistor MT, a plurality of read voltages are used. In the case where a plurality of read voltages are used, each of the read voltages can be shifted. Herein, for the simplification, even in the case where a plurality of read voltages are used, the controller 61 calculates a representative value of a plurality of the shifted amounts corresponding to the read voltages constituting the plurality of the read voltages and determines the changed amount of the threshold value distribution based on the calculated representative value. For example, the controller 61 may calculate the representative value based on a function having some or all of the plurality of the read voltages as parameters. In addition, the controller 61 may employ a sum value of the shifted amounts from the initial values of the read voltages as the representative value. In addition, the controller 61 may select one read voltage among the plurality of the read voltages and employ the shifted amount of the initial value of the selected one read voltage as the representative value. In addition, the controller 61 may employ a maximum value, an average value, or a central value among the shifted amounts from the initial values of the read voltages as the representative value. In addition, the controller 61 may store a plurality of parameter sets defining the plurality of the read voltages and store the parameter sets to be correlated with the respective different representative values. In this manner, the controller 61 can calculate the representative value by using some or all of the plurality of the read voltages. Hereinafter, as far as there is no particular notice, the shifted amount denotes the shifted amount as the representative value. The shifted amount may be a real number or an absolute value. Herein, for the simplification, the shifted amount is set as an absolute value.

The controller 61 manages a parameter P for the second process. Herein, since the refreshing is performed in units of a physical block set 15, the parameter P is managed for every physical block set 15. When the parameter P exceeds a predetermined value (C), the controller 61 performs refreshing on the corresponding physical block set 15. At the time of performing the reading, when the shifted amount exceeds a predetermined value (D), the controller 61 counts up the parameter P corresponding to the physical block set 15 of the reading destination by 1. In addition, in the case where the counting-up is already performed after the last performed erasure, the controller 61 does not perform counting up of the parameter P.

In addition, at the time of performing the reading, in the case where the first ECC circuit 51 fails in the error correction although the read voltage is shifted so that the shifted amount becomes the maximum value, the controller 61 performs refreshing of the physical block set 15 of the reading destination irrespective of the value of the parameter P with respect to the physical block set 15 of the reading destination.

Any condition can be employed as a condition of resetting the parameter P. Herein, as an example, when the level of the strength of the error correction is changed, the controller 61 resets the parameter P of the physical block set 15 of which the level of the strength of the error correction is changed. Otherwise, for example, the controller 61 may record information as to whether or not the counting-up of the parameter P is performed for every erasure, and when the erasure without performing the counting-up of the parameter P is performed consecutively predetermined times with respect to one physical block set 15, the controller may reset the parameter P of the physical block set 15.

Figure 18:
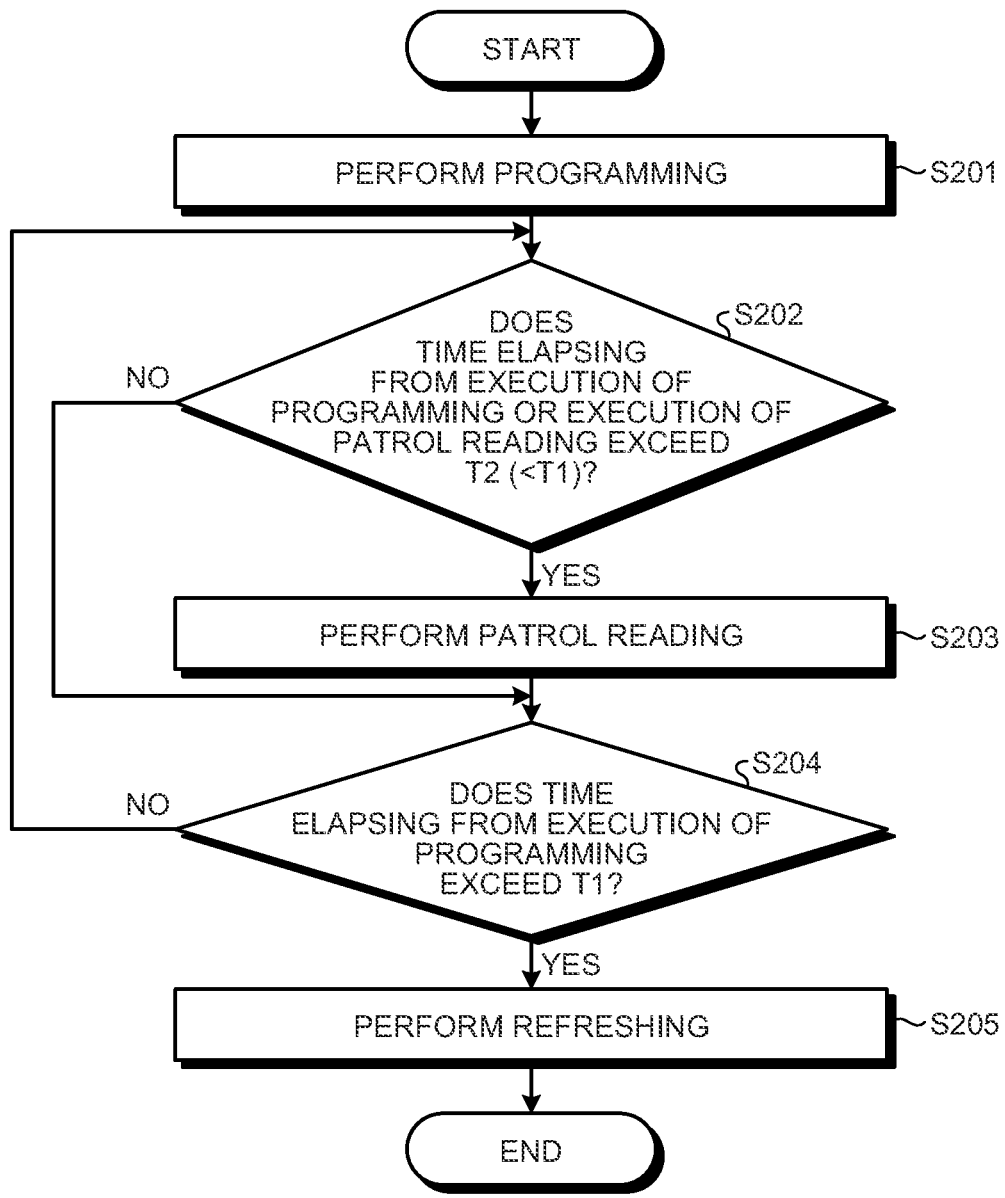
FIG. 18 is a flowchart for describing a first process.

FIG. 18 is a flowchart for describing a first process. The controller 61 executes the first process illustrated in this figure with respect to every physical block set 15. At the starting, one physical block set 15 which is focused in the description of this figure is erased and set to be in the state where no data is written therein.

First, the controller 61 performs programming (step S201). Next, the controller 61 determines whether or not the time elapsing from the execution of the programming or the time elapsing from the execution of the patrol reading exceeds a time T2 (step S202). T2 is smaller than T1. T2 may be set in advance to the controller 61, or T2 may be calculated dynamically like T1. The patrol reading is a process of reading programmed data according to a time elapsing from the execution of the programming irrespective of receiving a read command from the host 2. Herein, as an example, the patrol reading is described to be performed periodically (herein, every T2) from the execution of the programming. In addition, although the time reaches the timing of the execution of the patrol reading, in the case where there exist other processes which are to be performed prior to the patrol reading (for example, the process according to the read command from the host 2), the controller 61 may start the patrol reading after the process which is to be processed prior to the patrol reading is performed. In addition, the time elapsing from the execution of the programming may be a time elapsing from the start of the programming in the state where no data is written or may be a time elapsing after the physical block set 15 is full of data. In the case where the patrol reading is already performed, in step S202, the controller 61 determines whether or not the time elapsing from the execution of the last patrol reading exceeds a time T2.

The process of the patrol reading includes the second process. In some cases, the controller 61 may perform detection by setting the physical block set 15 as the refreshing target of the second process as a result of the second process during patrol reading. In this case, the controller 61 ends the first process in the middle of the performing thereof and performs refreshing according to the second process. Details of the second process will be described later.

In the case where the time elapsing from the execution of the programming or the time elapsing from the execution of the patrol reading exceeds a time T2 (Yes in step S202), the controller 61 executes the patrol reading (step S203). In the case where any one of the time elapsing from the execution of the programming and the time elapsing from the execution of the patrol reading does not exceed a time T2 (No in step S202), the controller 61 skips the process of step S203.

Subsequently, the controller 61 determines whether or not the time elapsing from the execution of the programming exceeds T1 (S204). In the case where the time elapsing from the execution of the programming exceeds T1 (Yes in S204), the controller 61 performs refreshing (S205) and ends the operations according to the first process. In the case where the time elapsing from the execution of the programming does not exceed T1 (No in S204), the controller 61 performs the process of step S202 again.

Figure 19:
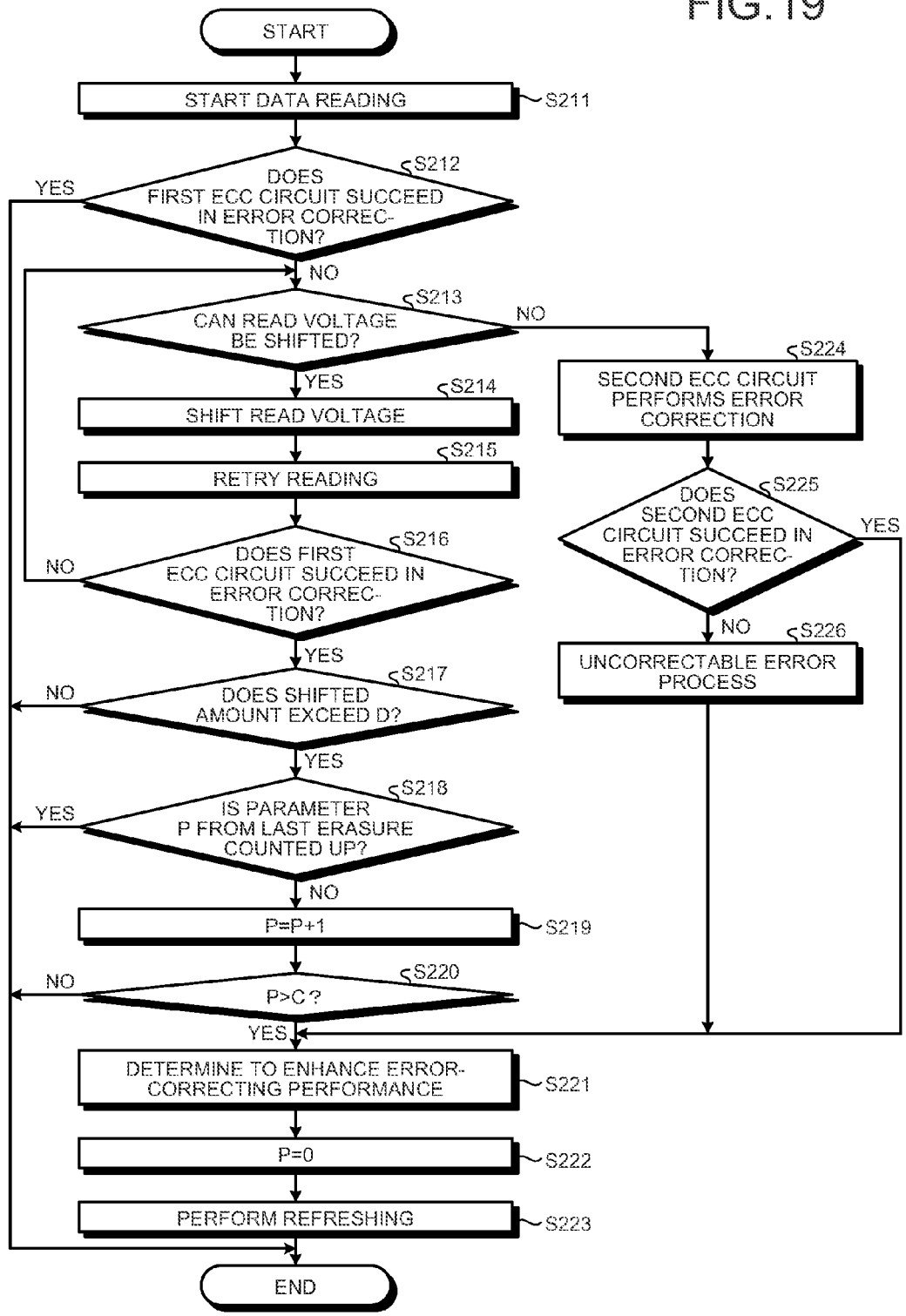
FIG. 19 is a flowchart for describing a second process.

FIG. 19 is a flowchart for describing a second process. The controller 61 performs the second process illustrated in this figure with respect to every physical block set 15. During starting, one physical block set 15 which is focused in the description of this figure is set to be in the state where data is already written therein.

First, the controller 61 starts the data reading (step S211). Herein, the reading includes reading according to a read command of the host 2 and reading according to the patrol reading. During the data reading, the first ECC circuit 51 performs the error correction, and the success or failure in the error correction is notified to the controller 61 by the first ECC circuit 51. In addition, only in the case of the failure in the error correction, the message of the failure may be notified to the controller 61. The controller 61 determines whether or not the first ECC circuit 51 succeeds in the error correction (step S212). In the case where the first ECC circuit 51 succeeds in the error correction (Yes in step S212), the controller 61 ends the second process.

In the case where the first ECC circuit 51 fails in the error correction (No in step S212), the controller 61 determines whether or not the shifting of the read voltage is possible (step S213). In the case where the current shifted amount does not reach a maximum value, the controller 61 determines that the shifting is possible. In the case where the current shifted amount reaches the maximum value, the controller determines that the shifting is not possible. In the case where the shifting of the read voltage is possible (Yes in step S213), the controller 61 performs shifting of the read voltage (step S214) and retries the reading (step S215).

Subsequently, during retrying of the reading, the controller 61 determines whether or not the first ECC circuit 51 succeeds in the error correction (step S216). In the case where the first ECC circuit 51 fails in the error correction (No in step S216), the controller 61 performs the process of step S213 again.

In the case where the first ECC circuit 51 succeeds in the error correction (Yes in step S216), the controller 61 determines whether or not the shifted amount of the read voltage from the initial value exceeds D (step S217). In the case where the shifted amount of the read voltage from the initial value does not exceed D (No in step S217), the controller 61 ends the second process.

In the case where the shifted amount of the read voltage from the initial value exceeds D (Yes in step S217), the controller 61 determines whether or not P is counted up from the last erasure (step S218). In the case where P is counted up from the last erasure (Yes in step S218), the controller 61 ends the second process.

In the case where p is not counted up from the last erasure (No in step S218), the controller 61 counts up P by 1 (step S219) and determines whether or not P exceeds C (step S220). In the case where P does not exceed C (No in step S220), the controller 61 ends the second process.

In the case where P exceeds C (Yes in S220), the controller 61 determines to enhance the error-correcting performance (step S221). For example, the controller 61 increases the level of the error-correcting performance by 1. After the process of step S221, the controller 61 resets P to zero (step S222). Next, the controller 61 performs refreshing (step S223) and ends the second process.

In the case where the shifting of the read voltage is not possible (No in step S213), the controller 61 causes the second ECC circuit 52 to perform error correction (step S224). Next, it is determined whether or not the second ECC circuit 52 succeeds in the error correction (step S225). In the case where the ECC circuit 52 succeeds in the error correction (Yes in step S225), the controller 61 performs a process of step S221. In the case where the second ECC circuit 52 fails in the error correction (No in step S225), the controller 61 performs an uncorrectable error process (step S226), and after that, performs a process of step S221.

The uncorrectable error process is a process for coping with the state where the data restoring is not possible. The uncorrectable error process can be arbitrarily designed. For example, the uncorrectable error process is a process of notifying the message indicating that the data is lost to the host 2. During the refreshing after the uncorrectable error process, the controller 61 refreshes only the data that is not lost.

Although the speeds of change of the threshold value distributions are the same between the case where the error-correcting performance is strong and the case where the error-correcting performance is weak, a success rate of the error correction by the first ECC circuit 51 of the case where the error-correcting performance is strong is higher than that of the case where the error-correcting performance is weak. Therefore, in the case where the error-correcting performance is strong, the reading can be performed by using a small shifted amount in comparison with the case where the error-correcting performance is weak. Namely, by enhancing the error-correcting performance, it is possible to suppress the speed of increase of the shifted amount.

In the second embodiment, the controller 61 performs refreshing according to the time elapsing from the execution of the programming by the first process. While the controller 61 performs the first process, the controller enhances the error-correcting performance of the physical block set 15 according to the shifted amount in the second process. Therefore, the controller 61 detects the physical block set 15 where the shifted amount may exceed the limit before the refreshing by the first process, so that it is possible to reduce the speed of increase of the shifted amount of the detected physical block set 15.

In addition, although it is described that the controller 61 enhances the error-correcting performance when the first ECC circuit 51 fails in the error correction even in the case where the shifted amount reaches the maximum value, the condition of the criterion for determining the enhancement of the error-correcting performance is not limited thereto. For example, the controller 61 may enhance the error-correcting performance when the shifted amount exceeds a value E that is larger than D and smaller than the maximum value.

In addition, although it is described that the controller 61 counts up P by 1 when the shifted amount exceeds D, the method of the counting-up is not limited thereto. For example, as the shifted amount becomes large, the controller 61 may increase a division width of the counting-up.

In addition, the user data 102 may be compressed by predetermined conversion in the controller 61, the NAND controller 7, or the like, and after that, the user data may be stored in the physical page set 17. In this case, the number of clusters that can be stored in one physical page set 17 may not be decreased as the error-correcting performance becomes strong.

In addition, although it is described that the setting of the refreshing and the error-correcting performance is performed for every physical block set 15, the unit of the setting of the refreshing and the error-correcting performance is configured to be arbitrary.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a memory including a region having a first size;
an ECC encoding unit configured to encode user data of a second size to generate encoded user data of the first size;
an interface unit configured to store the encoded user data in the region of the memory and to read the encoded user data from the region of the memory;
an ECC decoding unit configured to decode the encoded user data that has been read from the region of the memory and to detect an error in encoded user data that has been read from the region of the memory; and
a controller configured to change the second size of user data to be stored in the region of the memory according to the detection of the error in encoded user data read from the region of the memory.

2. The memory system according to claim 1,
wherein when the controller
changes the second size of user data to be encoded by the ECC encoding unit, the controller first erases all encoded user data stored in the region of memory.

3. The memory system according to claim 1,
wherein the region includes a first area and a second area different from the first area, the first area being where encoded user data is stored, the second area being where other encoded user data is stored, the other encoded user data being generated by encoding user data after the second size has been changed by the controller.

4. The memory system according to claim 1,
wherein the region is a page, a block, a plurality of blocks, or a memory chip.

5. The memory system according to claim 1, wherein the controller counts a number of times the error detected by the ECC decoding unit is an event where a number of error bits detected exceeds a first threshold value and decreases the second size for subsequent user data once the count of the number of times exceeds a second threshold value.

6. The memory system according to claim 5,
wherein the region includes a first area and a second area different from the first area, the first area being an area in which the encoded user data is stored, the second area being an area in which the other encoded user data is stored, the other encoded user data being generated by encoding user data after the second size has been changed by the controller.

7. The memory system according to claim 1,
wherein the region is a block, and
the controller counts a first number of times the error detected by the ECC decoding unit is an event where a number of error bits detected exceeds a first threshold value,
increments a second number in the case where the first number of times does not exceed a second threshold value, and does not increment the second number in the case where the first number of times exceeds the second threshold value, and
decreases the second size for subsequent user data in the case where the second number exceeds a third threshold value, the third threshold value being larger than the second threshold value.

8. The memory system according to claim 7,
wherein the block is one of a plurality of blocks, and
wherein the controller counts the first number of times for each of the plurality of the blocks.

9. The memory system according to claim 8, wherein the controller increments the second number for each of the plurality of the blocks.

10. The memory system according to claim 7,
wherein the controller
decreases the second size for encoding subsequent user data in the case where the second number exceeds the third threshold value
after erasing all encoded user data stored in the block.

11. The memory system according to claim 1, wherein the controller does not change the second size once the second size reaches a predetermined minimum value.

12. The memory system according to claim 1, wherein the region includes a plurality of areas, and
the controller does not change the second size after a number of failure areas included in the plurality of the areas reaches a predetermined first upper limit value.

13. The memory system according to claim 12, wherein the controller prohibits writing from the outside once the number of failure areas in the plurality of areas reaches a predetermined second upper limit value, the second upper limit value being equal to or larger than the first upper limit value.

14. The memory system according to claim 1,
wherein the region includes a memory cell array including a plurality of memory cells, each memory cell storing charges, and a peripheral circuit configured to read a value from each memory cell by comparing an amount of charge stored in each memory cell with a determination threshold value, the encoded user data having a plurality of values,
wherein the peripheral circuit reads the encoded user data from the memory cell array by using the determination threshold value,
the ECC decoding unit performs an error correction on the encoded user data read from the memory cell array,
the controller changes the determination threshold value in the case where the ECC decoding unit fails in the error correction,
the peripheral circuit reads the encoded user data again from the memory cell array by using the changed determination threshold value, and
the ECC decoding unit performs error correction of the encoded user data read from the memory cell array by using the changed determination threshold value,
wherein the controller changes the second size for encoding user data according to determination threshold value at which the ECC decoding unit succeeds in the error correction.

15. The memory system according to claim 14, wherein the controller counts a first number of times for which the ECC decoding unit changes the determination threshold value before the error correction succeeds and changes the second size according to the first number of times.

16. The memory system according to claim 15, wherein the controller decreases the second size for encoding subsequent user data in the case where the first number of times reaches a second threshold value.

17. The memory system according to claim 15,
wherein the region is a block, and
wherein the controller determines whether or not increment the first number of times according to whether or not all encoded user data stored in the block has been erased.

18. The memory system according to claim 15,
wherein the region is a block, and
the controller determines
to change the second size for encoding subsequent user data according to the first number of times;
performs refreshing on the encoded user data stored in the block, the refreshing including a process of erasing the encoded user data stored in the block; and then
performs the changing of the second size after the erasing.

19. The memory system according to claim 18,
wherein the interface unit reads out the encoded user data from the block at a timing according to a time elapsed since the storing of the encoded user data, and
wherein the controller performs refreshing in the case where the changing of the second size for encoding subsquent user data has been determined.

20. A memory system comprising:
a memory;
an ECC encoding unit configured to encode first data to generate second data;
an interface unit configured to store the second data in the memory and to read the second data from the memory; and
a controller configured to change a mode on the basis of a result of an error detection in the second data read from the memory, wherein
once the mode is changed, the ECC encoding unit encodes third data to generate fourth data, and
a ratio of a size of the third data to a size of the fourth data is smaller than a ratio of a size of the first data to a size of the second data.

* * * * *